United States Patent
Sahu et al.

(10) Patent No.: US 8,923,069 B2
(45) Date of Patent: Dec. 30, 2014

(54) MEMORY HAVING SELF-TIMED EDGE-DETECTION WRITE TRACKING

(75) Inventors: Rahul Sahu, Uttar Pradesh (IN); Vikash, Karnataka (IN); Kamal Chandwani, Gujarat (IN)

(73) Assignee: LSI Corporation, Milpitas, CA (US)

( * ) Notice: Subject to any disclaimer, the term of this patent is extended or adjusted under 35 U.S.C. 154(b) by 399 days.

(21) Appl. No.: 13/486,273

(22) Filed: Jun. 1, 2012

(65) Prior Publication Data

US 2013/0322193 A1 Dec. 5, 2013

(51) Int. Cl.
*G11C 16/06* (2006.01)

(52) U.S. Cl.
USPC ............ 365/185.23; 365/185.2; 365/233.5; 365/233.12

(58) Field of Classification Search
CPC .......... G11C 7/227; G11C 7/222; G11C 7/14; G11C 7/08; G11C 29/023
USPC ................. 365/185.23, 185.2, 233.5, 233.12
See application file for complete search history.

(56) References Cited

U.S. PATENT DOCUMENTS

| | | | |
|---|---|---|---|
| 4,982,187 A | 1/1991 | Goldstein et al. | |
| 6,347,063 B1* | 2/2002 | Dosaka et al. | 365/189.17 |
| 6,421,286 B1* | 7/2002 | Ohtani et al. | 365/200 |
| 6,643,204 B1* | 11/2003 | Agrawal | 365/210.1 |
| 6,888,841 B1 | 5/2005 | Ozaki | |
| 2004/0081006 A1 | 4/2004 | Takahashi | 365/200 |
| 2008/0037338 A1* | 2/2008 | Chen et al. | 365/194 |
| 2008/0298142 A1* | 12/2008 | Chen et al. | 365/194 |
| 2008/0298143 A1* | 12/2008 | Chen et al. | 365/194 |
| 2009/0183032 A1* | 7/2009 | Frey et al. | 714/42 |
| 2009/0231934 A1* | 9/2009 | Jung et al. | 365/189.15 |
| 2013/0308398 A1* | 11/2013 | Sharad et al. | 365/189.16 |

FOREIGN PATENT DOCUMENTS

EP 1414252 4/2004

* cited by examiner

*Primary Examiner* — Tuan T Nguyen
(74) *Attorney, Agent, or Firm* — Sheridan Ross P.C.

(57) ABSTRACT

A memory includes a self-timed column imitating a bitline loading, a self-timed row imitating a self-timed word-line, a self-timed bitcell performing a dummy write in a write cycle, a writer driver coupled to the self-timed bitcell for an actual write, and an edge detection circuit coupled to the self-timed bitcell for tracking a write cycle time.

22 Claims, 6 Drawing Sheets

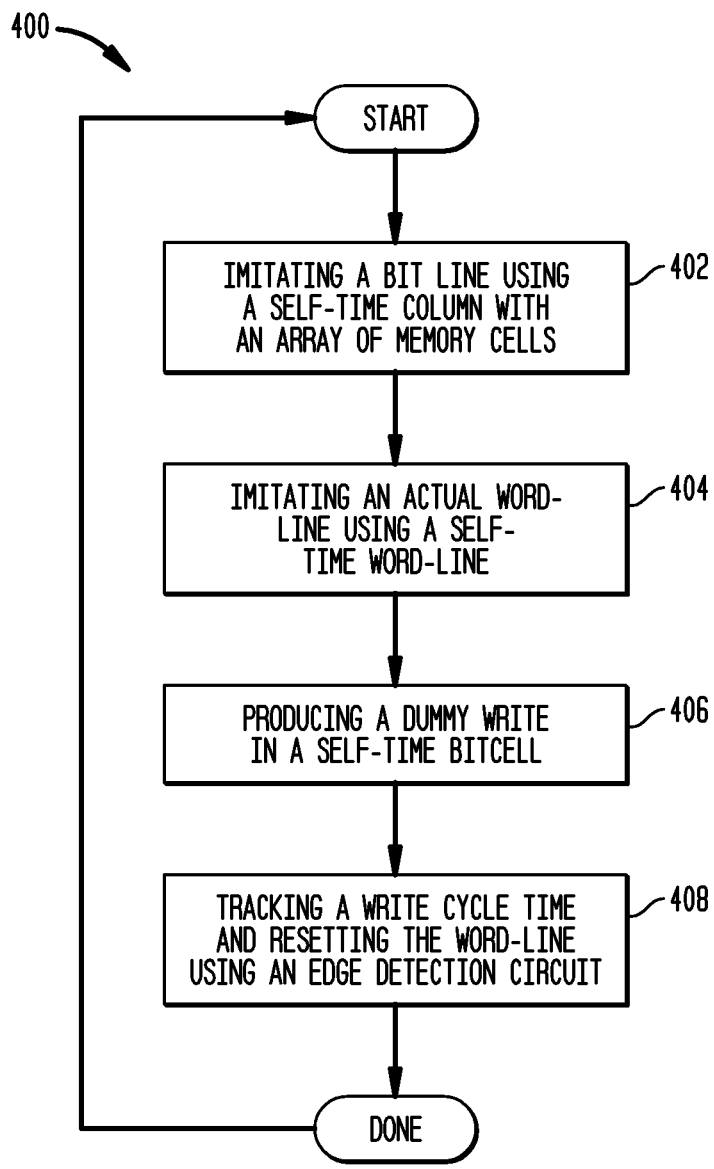

MEMORY HAVING SELF-TIMED EDGE-DETECTION WRITE TRACKING

BACKGROUND OF THE INVENTION

1. Field of the Invention

The present invention relates to integrated circuit memories generally, and, in particular, to integrated circuit memories with write tracking.

2. Description of the Related Art

Memory devices generally employ a write tracking scheme to track events in a write operation of data to memory. In a conventional tracking scheme, an internal clock is generated with an external clock. The generated internal clock, in turn, generates a self-timed word-line (STWL) that enables multiple bitcells in a self-timed column, imitating a load of an actual bitline. The STWL triggers the multiple bitcells in the self timed column through digital programming that controls the discharge rate of the self-timed bitline to ensure enough differential signal drive on the actual bitlines for a successful read operation. A sense amplifier enable signal (SEN) is then generated after ensuring sufficient differential signal at statically worst-case sense-amplifier internal nodes. Sufficient SEN pulse width is required to complete the sensing and digitization of the signal. When the SEN closes, the complete read cycle is then closed by pre-charging sense amplifier internal nodes and bitlines. However, since no real tracking of the write into the memory array occurs, this conventional tracking scheme mainly tracks the read operation accurately, instead of the write operation.

Other existing write tracking schemes track the write operation through triggering the write into a dummy array that requires a PRESET operation (i.e., setting the memory cell contents to predefined values in every tracking cycle) followed by a dummy write to detect a "Low" to "High" transition. Due to the additional PRESET operation, however, the write cycle time increases significantly, limiting the overall cycle time.

SUMMARY OF THE INVENTION

In one embodiment, the present invention is a memory comprising a control including an internal clock generation circuit that generates a self-timed clock signal, a self-timed row decoder placed above the control and triggering a self-timed word-line by receiving the self-timed clock signal, row decoders each triggering a word-line based on an address input to the control, an array of memory cells arranged in M columns of memory cells and N rows of memory cells, a self-timed column containing N bitcells arranged in a column similar to the column in the array of the memory cells wherein N is the number of the rows in the array of the memory cells, the self-timed column attached to the M columns of the array of the memory cells, a self-timed row containing M bitcells arranged in two rows similar to the row in the array of the memory cells wherein M is the number of the columns in the array of the memory cells, the self-timed row attached to the N rows of the array of the memory cells, a self-timed bitcell placed at the bottom of the self-timed column for providing a dummy cell used to perform a dummy write in a write cycle, and a self-timed input-output module coupled to the self-timed bitcell for writing art opposite data to the previous state in the self-timed bitcell, the self-timed input-output module including a write driver and an edge detection circuit, wherein the writer driver is coupled to the self-timed bitcell for receiving signals from internal nodes of the self-timed bitcell for an actual write, and the edge detection circuit is coupled to the self-timed bitcell for receiving the signals from the internal nodes of the self-timed bitcell for tracking a write cycle time.

In another embodiment, the present invention is a method for a memory comprising imitating a bitline using a self-timed column with an array of memory cells, imitating an actual word-line using a self-timed word-line generated by a self-timed row decoder, producing a dummy write in a self-timed bitcell, and tracking a write cycle time and resetting an actual word-line using an edge detection circuit.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

FIG. 6 is a flow chart illustrating an exemplary method for the memory with the edge detection based write tracking control shown in FIG. 1.

DETAILED DESCRIPTION

Hereinafter, embodiments of the present invention are described with reference to the drawings. The embodiments of the present invention relate to configuration of a memory with an edge detection based, self-timed write tracking. The edge detection based self-timed write tracking is employed for high speed and accurate write tracking, wherein an edge detection circuit (EDC) detects a worst case write transition ("Low to High") on either side of memory cell storage nodes. Further, the EDC writes opposite data on a self-timed bitcell in every write cycle, substantially reducing or otherwise eliminating the need for PRESET operation prior to a memory cell write operation for every write cycle. Consequently, embodiments of the present invention reduce electro-migration impact on self-timed bitcell internal nodes because in every cycle opposite data is written (if '1' is stored then '0' will be written and vice-versa). In addition, edge detection based write self-timed tracking scheme ensures a fast cycle time, when read and write operations are being done in two opposite phases of the external clock. In this case total cycle time will be the sum of individual read and write cycle times rather than in the conventional scheme, where two times of the higher of the cycle times out of read and write is quoted as the total cycle time.

The following detailed description utilizes a number of acronyms, which are generally well known in the art. While definitions are typically provided with the first instance of each acronym, for convenience, the following table provides a list of the acronyms and abbreviations used along with their respective definitions.

Table of Acronym Definition

| Acronym | Description |
| --- | --- |
| CLK | Clock |
| CLKGEN | Clock Generator |
| CRTL | Control |
| EM | Electro-Migration |
| IO | Input-Output |
| PREDEC | Pre-decoder |
| PMOS | P-typed Metal-Oxide-Semiconductor |
| RDEC | Row Decoder |
| RST | Reset |
| SRAM | Static Random Access Memory |
| STBITCELL | Self-timed Bitcell |
| STCLK | Self-timed Clock |
| STCOL | Self-timed Column |
| STIO | Self-timed Input-Output |
| STRDEC | Self-timed Decoder |
| STROW | Self-timed Row |
| STWL | Self-timed Word-Line |
| WL | Word-Line |
| WRDRV | Write Driver |
| WSTBLA | Write Self-timed Bitline |
| WSTBLAN | Write Self-timed Bitline complement |

Figure 1:
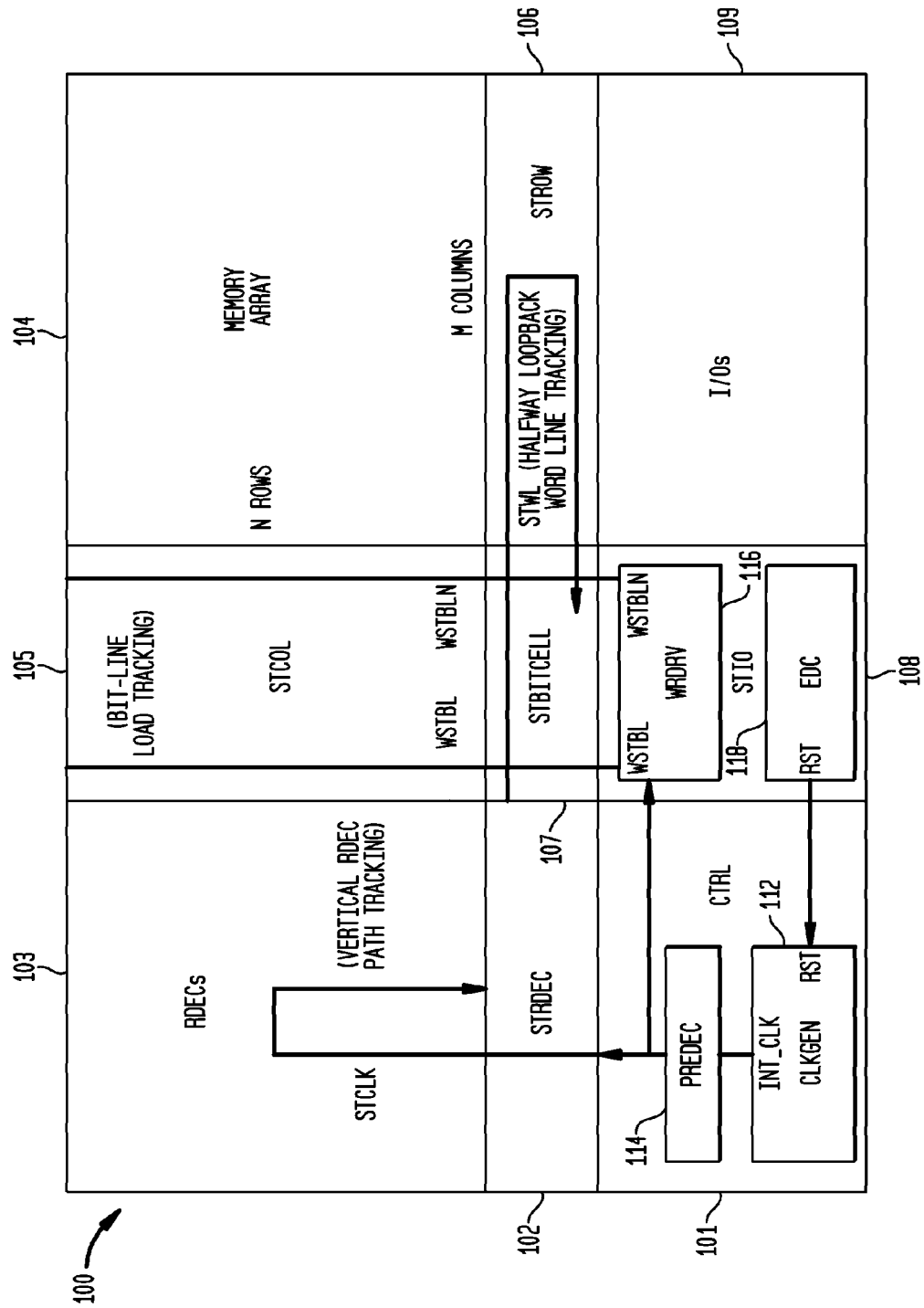
FIG. 1 is a simplified block diagram of an exemplary memory with an edge detection based write tracking control with a tracking signal path according to one embodiment of the invention.

Referring to FIG. 1, a simplified block diagram of an exemplary memory 100 with an edge detection based write tracking control scheme is shown in accordance with an exemplary embodiment of the present invention.

As shown in FIG. 1, memory 100 comprises control (CTRL) 101 including internal clock generator (CLKGEN) 112 and pre-decoder (PREDEC) 114, self-timed row decoder (STRDEC) 102, row decoder block (RDECs) 103 including a plurality of row decoders, memory array 104, self-timed column (STCOL) 105, self-timed row (STROW) 106, self-timed bitcell (STBITCELL) 107, self-timed input-output module (STIO) 108 (including write driver (WRDRV) 116 and edge detection circuit (EDC) 118), and plurality of input-output interfaces (IOs) 109.

CTRL 101 includes CLKGEN 112 and PREDEC 114. CLKGEN 112 is a dynamic internal clock generation circuit. CLKGEN 112 receives a reset signal (RST) and an external clock signal (CLK) and generates a self-timed clock (STCLK) signal as an output timing reference.

The STCLK signal provided from CTRL 101 is employed as an internal clock. The STCLK signal is provided to STRDEC 102, WRDRV 116 and EDC 118, respectively. The STCLK may be generated by employing a positive edge of the external clock CLK and may be reset by a negative edge of the reset signal RST.

PREDEC 114 is included in CTRL 101 and receives the STCLK to generate pre-decoded signals which propagate to RDECs 1.03 to generate actual write word-lines (WLs).

STRDEC 102 is adjacent and coupled to CTRL 101. At the beginning of a write cycle, as the STCLK signal rises and arrives at STRDEC 102, STRDEC 102 triggers a self-timed word-line (STWL). The STCLK signal then propagates toward a half number of RDECs 103 (or a half number of rows of RDECs 103) with proper loading of the memory cell's transistor gates so as to return back to STRDEC 102. Consequently, the STCLK signal tracks the pre-decoded signal path for matching the generation of an actual write word-line. The STWL is generated in STRDEC 102 at the arrival of positive edge of the STCLK. The STCLK signal that tracks back to STRDEC 102 then asserts high the STWL signal provided to STBITCELL 107 with the same delay as the actual write word-line.

RDECs 103 includes a plurality of row decoders. One row decoder 103 may be activated which, in turn, triggers one word-line according to the address input to CTRL 101.

Memory array 104 includes an array of memory cells arranged into M columns of memory cells and N rows of memory cells. The M columns and N rows of memory cells may be embodied as or with any existing and/or emerging types of memory cells known in the art. In one embodiment of the present invention, the memory cell may be a plurality of 6 transistor CMOS bitcells (6T-bitcells). Memory array 104 has the same number of rows as the number of rows in RDECs 103. In another embodiment of the present invention, memory array 104 may be a SRAM.

STCOL 105 is a column containing N bitcells where N is the number of rows in memory array 104. For embodiments of the present invention, the N bitcells in STCOL 105 may be embodied as or with any existing and/or emerging types of memory cells. In one embodiment of the invention, the N bitcells may be N 6T-bitcells such as for the memory cells of memory array 104. The N bitcells have a common bitline defined as write self-timed bitline (WSTBL) and write self-timed bitline-bar (WSTBLN). STCOL 105 is desirably employed to imitate the bitline loading during a write operation.

STROW 106 is desirably embodied an array of bitcells arranged in two rows similar to the regular row in the memory array area. STROW 106 might be a dummy row employed to track with relatively exact precision the bitline loading of an actual row. In order to imitate the path of the actual write word-line, STROW 106 or a dummy row is desirably located in a given implementation of an integrated circuit (IC) memory just above IOs 109 and below memory array 104. The STWL travels toward a halfway point of columns of STROW 106 and returns back (halfway loopback) to track the actual write word-line path. The returned STWL is then applied to STBITCELL 107. In this manner, the STWL imitates the loading of one full regular row.

STBITCELL 107 is desirably located at the bottom of STCOL 105 in a given implementation. STBITCELL 107 might be a dummy bitcell employed to perform a dummy write during a write tracking operation. STBITCELL 107 might be implemented as or with any existing and/or emerging types of memory bitcells. In one embodiment of the invention, STBITCELL 107 might be implemented with a standard 6T-bitcell.

Figure 2:
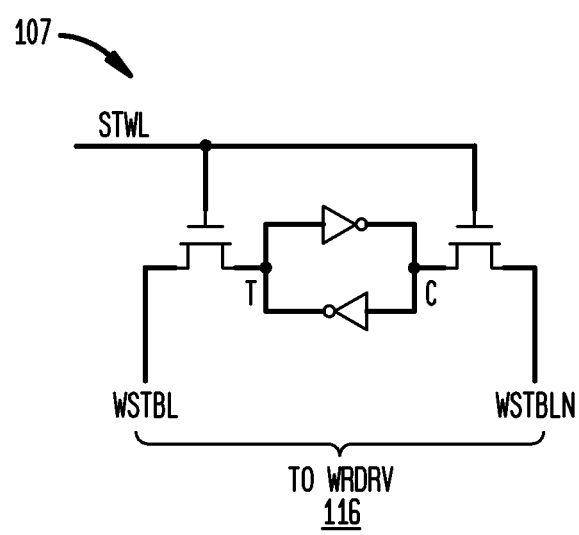
FIG. 2 is a simplified schematic diagram of an exemplary standard 6-transistor CMOS bitcell for the memory with the edge detection based write tracking control of FIG. 1.

FIG. 2 shows an exemplary schematic diagram of a standard 6T-bitcell 207 used in memory 100 with the edge detection based write tracking control shown in FIG. 1. Standard 6T-bitcell 207 includes a bi-stable flip-flop connected to the internal circuitry by two pass transistors. Standard 6T-bitcell 207 has three inputs: one input is write self-timed bitline (WSTBL), a second input is write self-timed bitline-bar (WSTBLN), and the third input is self-timed word-line (STWL). The positive edge on STWL along with the falling edge on WSTBL (or WSTBLN) causes toggling of internal nodes, T and C, of standard 6T-bitcell 207 (shown in FIG. 5). Similarly, standard 6T-bitcell 207 might be employed as a dummy bitcell in the memory which exactly imitates an actual bitcell and is used to determine the write time to perform a write tracking operation.

Returning to FIG. 1, in memory 100, of the N bitcells in STCOL 105 and STBITCELL 107, desirably only one bitcell, STBITCELL 107, might be controlled by the STWL generated in STRDEC 102. Other N bitcells in STCOL 105 are not necessarily controlled by any word-line (WL) signal and the N bitcells in STCOL 105 act as loading bitcells for STBITCELL 107.

As shown in FIG. 1, STIO module 108 includes two sub-blocks, WRDRV 116 and EDC 118. The internal nodes, C and T, of STBITCELL 107 connect to STIO 108 and provide inputs to WRDRV 116 and EDC 118, respectively. Consequently, STIO 108 writes opposite data into STBITCELL 107. That is, if STBITCELL 107 stores "0", then STIO 108 writes "1" into STBITCELL 107, and vice-versa.

WRDRV 116 provides an input and output (I/O) function employed for an actual write operation. WRDRV 116 is coupled to STBITCELL 107 to receive a complement of the T node of STBITCELL 107 as D node of WRDRV 116, WRDRV 116 also receives a complement of the C node of STBITCELL 107 as DN node of WRDRV 116. The STCLK is also provided to WRDRV 116. With these three inputs, WRDRV 116 generates the WSTBL signal and its complement WSTBLN, which are then provided into the N bitcells of STCOL 105.

Figure 3:
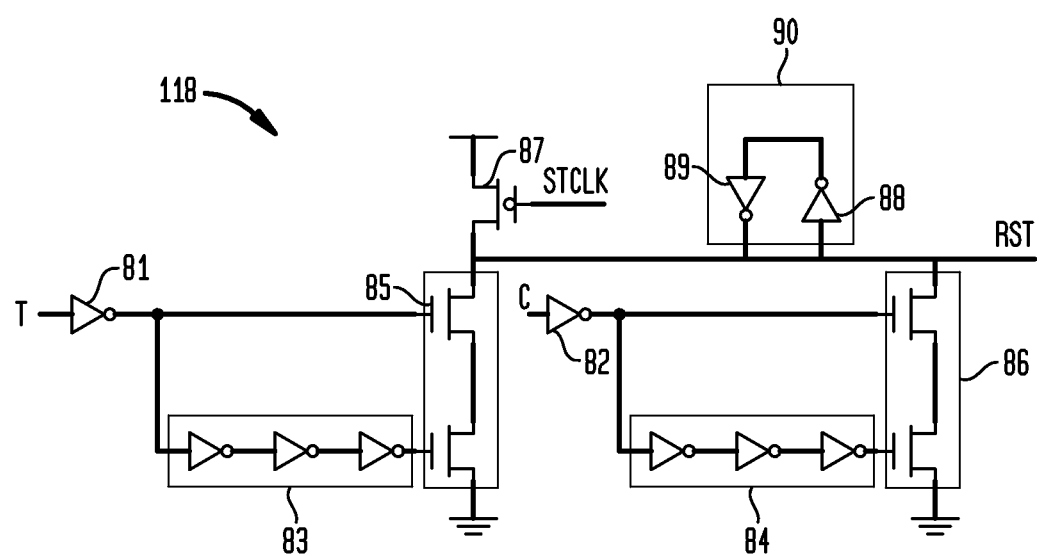
FIG. 3 is a simplified schematic diagram of an exemplary edge detection circuit for the memory with the edge detection based write tracking control of FIG. 1.

An exemplary embodiment of EDC 118 is shown in FIG. 3. As shown, EDC 118 includes two inverter receivers 81, 82, two delay lines 83, 84 formed with three inverters, two stacked NMOS gates 85, 86 receiving signals with and without a respective delay line, a PMOS 87 and an inverter feedback loop 90. Two stacked NMOS gates 85, 86 have an upper stacked device and a lower stacked device, respectively. The upper stacked devices are connected to inverter receivers 81, 82, respectively, which have one inverter delay. The lower stacked devices are connected to delay lines 83, 84, respectively, which have four inverter delay. Thus, the upper stacked device gets input earlier than the lower stacked device by three inverter delay. During the three inverter delay period, either one of T and C nodes goes low, both the upper and lower stacked devices of stacked NMOS gates 85, 86 are on, which pull RST node low. EDC 118 might be implemented so that EDC 118 substantially always senses a node which goes to high (i.e., the worst write time case). Receivers 81, 82 of EDC 118 receive the T and C nodes of STBITCELL 107. The STCLK is applied to the gate of PMOS 87. EDC 118 generates a reset signal (RST) as an output. When i) the positive edge of STCLK is generated at the beginning of a write cycle, ii) a falling edge of the T node or a rising edge of the C node of EDC 118, or iii) a rising edge of the T node or a falling edge of the C node of STBITCELL 107, occurs, this event results in a falling edge of the RST signal. Here, the T and C nodes of EDC 118 are opposite in values "0" or "1" to the T and C nodes of STBITCELL 107. The RST signal generated by EDC 118 is then provided to CLKGEN 112, which resets CLKGEN 112, which, in turn, resets the STCLK. As such, the actual write word-line and the STWL are disabled or otherwise shut off (See FIG. 5) and the actual word line and the STWL are reset. Thus, the reset signal output from EDC 118 tracks the memory cell to write more accurately.

FIG. 1 also shows the loopback characteristic of the STCLK from a halfway to the top, which generally ensures that the resistance-capacitance and gate loading on the STCLK matches the resistance-capacitance loading of pre-decoded signal generated by PREDEC 114. Further, FIG. 1 also shows the loopback characteristic of the STWL from a half way to the extreme right of the Figure, which generally ensures that the resistance-capacitance and gate loading on the STWL matches the resistance-capacitance and gate loading of any other word-line generated by RDECs 103. In addition, FIG. 1 also shows the resistance-capacitance and diffusion loading on WSTBL and WSTBLN of the bitcells of STCOL 105. Referring to FIG. 2, WSTBL and WSTBLN are connected to a respective pass transistor of the bitcells placed in the STCOL 105, which performs to load the resistance-capacitance and diffusion.

Figure 4:
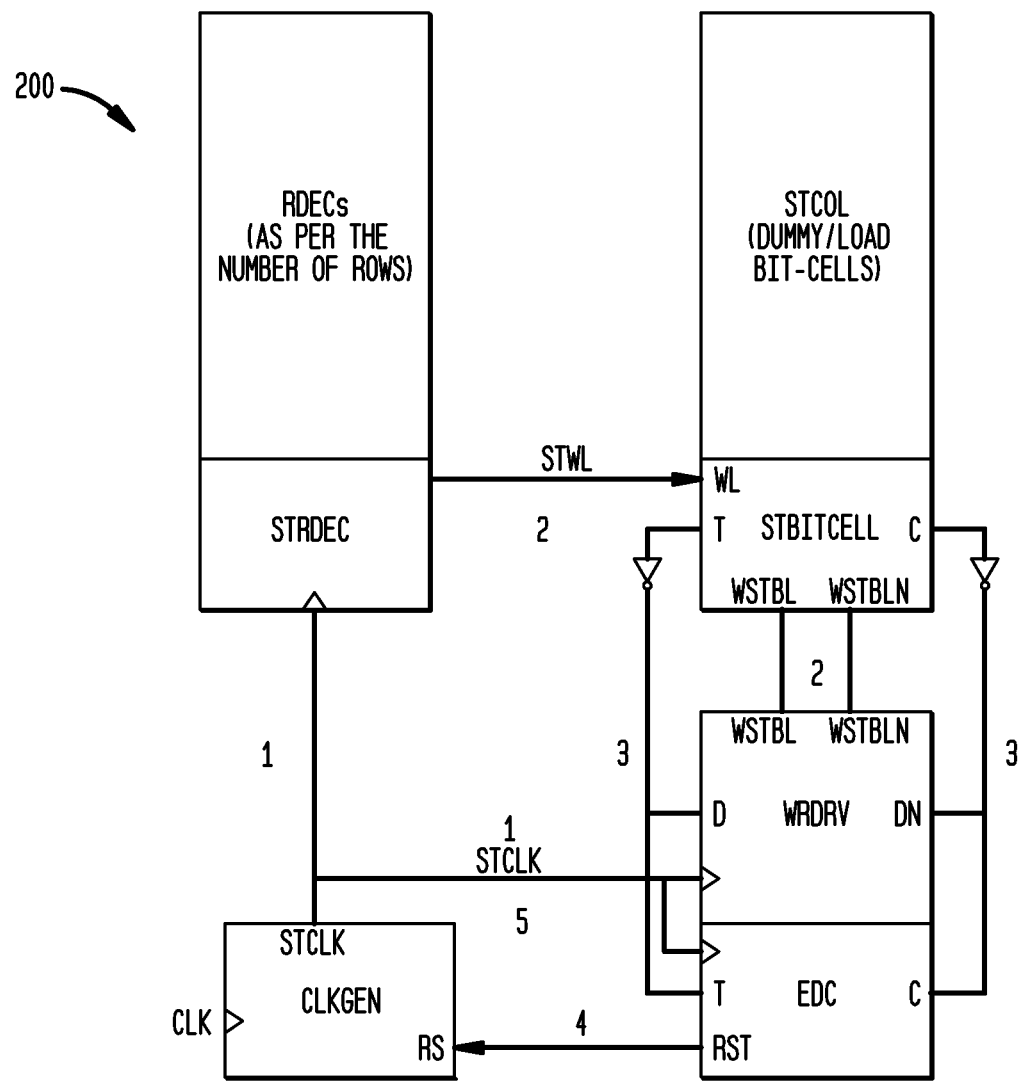
FIG. 4 is an exemplary simplified schematic block diagram of an edge detection based write tracking control of the memory according to the embodiment of FIG. 1.
Figure 5:
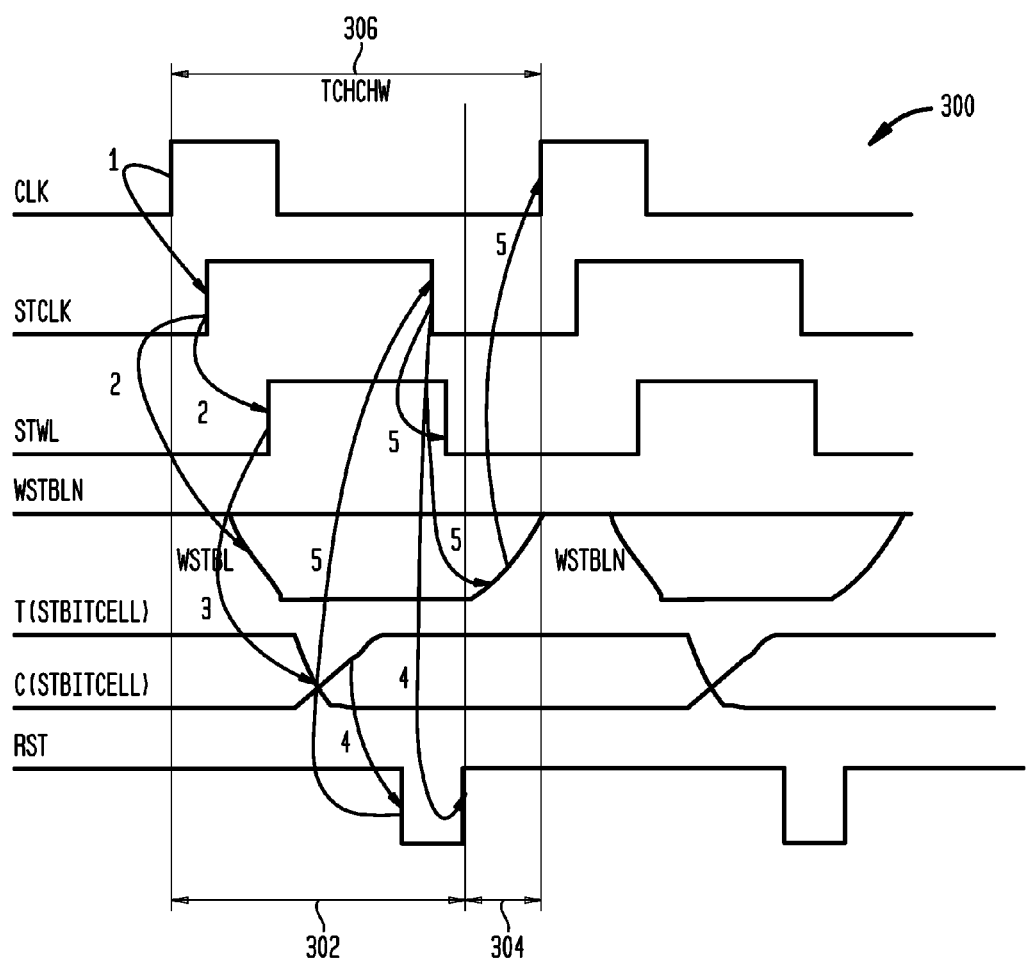
FIG. 5 is an exemplary timing diagram showing the waveforms of signals in the memory with the edge detection based write tracking control shown in FIG. 4 during a write tracking operation.

The edge detection based write tracking and the write tracking signal path are described in more detail below referring to FIG. 4 in combination with FIG. 5. The operation of the edge detection based self-timed writing tracking may be understood through the waveforms for the entire write self-timed operation, as shown in FIG. 5. FIG. 4 is a simplified block diagram of memory 200 with the edge detection based write tracking control showing a sequence of events during a write-tracking operation. FIG. 5 is a timing diagram showing the waveforms 300 of signals in the memory with the edge detection based write tracking control shown in FIG. 4 during a write tracking operation. The arrows in FIG. 5 represent the sequence of events and also include the triggering signals for the respective triggered signals.

As shown, in event 1, a write tracking cycle starts with an external clock (CLK) received by CLKGEN 112, CLKGEN 112 then generates a positive edge of the STCLK which, in turn, propagates to STRDEC 102, WRDRV 116 and EDC 118, respectively.

In the second event, the positive edge of the STCLK triggers the STWL through STRDEC 102. In parallel, the positive edge of the STCLK also triggers a failing edge of the WSTBL or WSTBLN based on the state of complement of T and C nodes of STBITCELL 107 from the previous write cycle.

In event 3, a positive edge of the STWL along with the failing edge of either WSTBL or WSTBLN triggers the internal nodes, T and C, of STBITCELL 107 resulting in a toggling of the internal nodes, T and C, of STBITCELL 107.

In the following event, event 4, the toggling of the internal T and C nodes of STBITCELL 107 generates a falling edge of a reset (RST) signal produced by EDC 118.

In event 5, the falling edge of the RST signal causes a falling edge of the STCLK generated by CLKGEN 112 which, in turn, brings a positive edge of the RST signal. The RST signal then reset CLKGEN 112 through this process. The failing edge of the STCLK also results in a pre-charging of either the WSTBL or WSTBLN depending on which one falls during the present write cycle. After the event 5, the write-tracking path is ready for the next write tracking cycle.

In summary, at the beginning of a write cycle, the positive edge of STCLK is generated, the STLK then triggers a falling edge of the T node or a falling edge of the C node of EDC 118, or a rising edge of the T node or arising edge of the C node of STBITCELL 107, which results in a falling edge of the RST signal. Further, the positive edge on STWL along with the falling edge on WSTBL (or WSTBLN) results in toggling of internal nodes, T and C, of STBITCELL 107 which flips contents of STBITCELL 107 to an opposite state in a write cycle. Thus, a dummy write is occurred on STBITCELL 107.

As shown in FIG. 5, the pre-charging of the WSTBLs is started through the derivative of the STCLK, which in turn is employed for pre-charging the WSTBLs. Once the bitlines are pre-charged, a new write cycle is started. In this case, write cycle time (Tchchw) 306 is the sum of bitcell write time 302 and write bitline pre-charge time 304.

FIG. 6 is a flow chart illustrating an exemplary method for memory 400 with the edge detection based write tracking control shown in FIG. 1. At step 402, a bitline is imitated by using a self-timed column with an array of memory cells. At step 404, an actual word-line is imitated by using a self-timed word-line generated by a self-timed row decoder. At step 406, a dummy write is produced in a self-timed bitcell placed at the bottom of the self-timed column. At step 408, a write cycle time is tracked and a word-line is reset by using an edge detection circuit.

In embodiments of the present invention, in each write cycle, the dummy write is performed in STBITCELL 107 of FIG. 1, which changes the contents of the bitcell opposite to the previous state, and then edge detection circuit 118 detects the transition of the node C or T to high. The dummy write operation is performed in substantially the same manner as a write operation performed in a regular write fashion. Furthermore, the write bitline loading is closer to that experienced in an actual write bitline. In substantially every write cycle the data opposite to the previous state is being written, i.e., if '0' is stored then '1' will be written and vice-versa, which helps avoiding the electro-migration (EM) issue on the internal nodes of the bitcells.

Advantageously, in combination with the existing read tracking, memories with the edge detection based write tracking control might perform a self-timed read and write function so as to achieve an independent and efficient write cycle time. An additional self-timed column and self-timed row for the write tracking provided in the memory array enables the memories to reduce the write cycle time. When read and write ports need to be operated at different frequencies, the edge detection based self-timed write tracking is vital and applicable to single port memories and multiport memories with dedicated read/write Ports. Furthermore, by allocating the read and write operations in the memories in the two opposite phases of the external clock, the edge detection based self-timed write tracking may provide the most efficient cycle time across the process variation corners (PVTs), which improves the yield without significantly impacting the write cycle time and/or full cycle time.

It is understood that while the embodiment shown herein is a typical edge detection circuit and a standard 6-transistor CMOS Bitcell. The invention may be implemented in several ways by using various edge detection schemes and memory cells known in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs 6; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at feast two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers genetically to either the source or drain of a metal-oxide semiconductor (MOS) transistor device (also referred to as a MOSFET), and the term "control node" refers genetically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

No claim element herein is to be construed under the provisions of 35 U.S.C. §112, sixth paragraph, unless the element is expressly recited using the phrase "means for" or "step for."

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A memory comprising:
   a control including an internal clock generation circuit that generates a self-timed clock signal;
   a self-timed row decoder adjacent to the control and adapted to trigger a self-timed word-line based on the self-timed clock signal;
   at least one row decoder, each row decoder adapted to trigger a word-line based on an address input to the control;
   an array of memory cells arranged in M columns and N rows, M and N positive integers;
   a self-timed column having N bitcells arranged in a column substantially similar to each column in the array of the memory cells, the self-timed column coupled to the M columns of the array of the memory cells;
   a self-timed row having M bitcells arranged in two rows substantially similar to each row in the array of the memory cells, the self-timed row coupled to the N rows of the array of the memory cells;
   a self-timed bitcell adjacent to the bottom of the self-timed column and adapted to act as a dummy cell for a dummy write in a write cycle; and
   a self-timed input-output module coupled to the self-timed bitcell adapted to write an opposite data to the previous state in the self-timed bitcell, the self-timed input-output module including a write driver and an edge detection circuit,
   wherein the writer driver is coupled to the self-timed bitcell for receiving signals from internal nodes of the self-timed bitcell for an actual write operation, and the edge detection circuit is coupled to receive signals from internal nodes of the self-timed bitcell and adapted to track a time of the write cycle.

2. The memory of claim 1, further comprising a pre-decoder adapted to generate pre-decoder signals provided to the row decoders to generate actual word-lines.

3. The memory of claim 2, wherein the self-timed clock signal propagates toward a half number of the row decoders with a proper loading of gates and returns so as to track the pre-decoder signals for matching the generation of each actual write word-line.

4. The memory of claim 1, wherein, when the self-timed clock signal asserts, the self-timed word-line generated from the self-timed row decoder exhibits a substantially equivalent delay as the actual write word-line.

5. The memory of claim 1, wherein, in the write cycle, the self-timed column imitates a bitline loading and the self-timed word-line imitates the actual write word-line.

6. The memory of claim 5, wherein the self-timed word-line loops through a halfway point of the self-timed row and returns to the self-timed bitcell for tracking the actual write word-line.

7. The memory of claim 1, wherein the dummy write occurs when the self-timed bitcell flips memory cell contents to an opposite state in the write cycle.

8. The memory of claim 7, wherein the edge detection circuit detects a worst case write transition on either side of memory cell storage nodes and writes the opposite data on the self-timed bitcell to the immediate previous state in substantially every write cycle to track the write cycle time.

9. The memory of claim 8, wherein the edge detection circuit is configured to generate a reset signal that resets the stacked NMOS internal clock generation circuit and, upon resetting the internal clock generation circuit, the actual word-line and the self-timed word-line are disabled.

10. The memory of claim 1, wherein the edge detection circuit includes two delay lines formed by three inverters, two gates along with the respective delay line, a positive feedback loop formed by two inverters, and a PMOS that receives the self-timed clock signal.

11. The memory of claim 1, wherein the write driver receives signals from internal nodes of the self-timed bitcell and the self-timed clock signal to generate a write self-timed bitline and a write self-timed bitline complement input into the self-timed column and the self-timed bitcell.

12. The memory of claim 1, wherein the write self-timed bitline and a write self-timed bitline bar are pre-charged at a falling edge of the self-timed clock.

13. The memory of claim 12, wherein the write cycle time is substantially equivalent to a sum of a bitcell write time and a write bitline pre-charge time.

14. The memory of claim 1, wherein read and write operations in the array of the memory cells occur in opposite phases of the external clock.

15. The memory of claim 1, wherein at least one of the self-timed bitcell and the memory cells are 6 transistor CMOS bitcells.

16. A method for a memory comprising:
   imitating a bitline using a self-timed column with an array of memory cells;

imitating an actual word-line using a self-timed word-line generated by a self-timed row decoder;
producing a dummy write in a self-timed bitcell;
tracking a write cycle time and resetting an actual word-line using an edge detection circuit;
providing an external clock signal to an internal clock generation circuit to generate a self-timed clock signal;
propagating the self-timed clock signal toward a half number of row decoders with a proper loading of gates; and
returning the self-timed clock signal to track pre-decoder signals generated by a pre-decoder and so matching the generation of the actual write word-line.

17. The method of claim 16, further comprising asserting, by the self-timed clock signal, to the self-timed word-line generated from the self-timed row decoder with a substantially equivalent delay as the actual write word-line.

18. The method of claim 17, further comprising propagating the self-timed word-line toward a halfway point of the self-timed row and returning the self-timed word-line to the self-timed bitcell for tracking the actual write word-line.

19. The method of claim 18, further comprising flipping memory cell contents of the self-timed bitcell to an opposite state to the immediate previous state in the write cycle in the dummy write.

20. The method of claim 19, further comprising detecting a worst case write transition on either side of memory cell storage nodes and writing opposite data on the self-timed bitcell to the immediate previous state in substantially every write cycle to track write cycle time with the edge detection circuit.

21. The method of claim 20, further comprising generating a reset signal and resetting the internal clock generation circuit in the edge detection circuit based on the reset signal, wherein, upon resetting the internal clock generation circuit, the actual word-line and the self-timed word-line are disabled.

22. The method of claim 21, further comprising:
triggering the self-timed word-line using a positive edge of the self-timed clock and triggering a falling edge of a write self-timed bitline or a write self-timed bitline bar of the self-timed bitcell;
toggling of the internal nodes of the self-timed bitcell causing a falling edge of the reset signal;
producing a falling edge of the self-timed clock using the falling edge of the reset signal, which brings a positive edge of the reset signal; and
pre-charging the write self-timed bitline and the write self-timed bitline bar during the write cycle.

* * * * *